US010126767B2

United States Patent
Kubo et al.

(10) Patent No.: US 10,126,767 B2
(45) Date of Patent: Nov. 13, 2018

(54) SEMICONDUCTOR DEVICE HAVING A REGULATOR

(71) Applicant: RENESAS ELECTRONICS CORPORATION, Tokyo (JP)

(72) Inventors: Terunori Kubo, Tokyo (JP); Tatsuya Ishikawa, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/472,196

(22) Filed: Mar. 28, 2017

(65) Prior Publication Data

US 2017/0285673 A1 Oct. 5, 2017

(30) Foreign Application Priority Data

Mar. 29, 2016 (JP) .................................. 2016-065278

(51) Int. Cl.
| | |
|---|---|
| G05F 1/10 | (2006.01) |
| G05F 1/56 | (2006.01) |
| G05F 1/59 | (2006.01) |
| H03K 17/687 | (2006.01) |
| H03K 19/0175 | (2006.01) |

(52) U.S. Cl.
CPC ............. *G05F 1/56* (2013.01); *H03K 17/687* (2013.01); *H03K 19/017509* (2013.01)

(58) Field of Classification Search
CPC . H03K 19/017509; H03K 17/687; G05F 1/56
See application file for complete search history.

(56) References Cited

U.S. PATENT DOCUMENTS

| | | | | |
|---|---|---|---|---|
| 6,735,064 B2* | 5/2004 | Miyazaki | ................ | G05F 1/652 323/299 |
| 7,586,727 B2* | 9/2009 | Yamashita | ............ | B60L 3/0046 307/131 |
| 2014/0049238 A1* | 2/2014 | Hu | ......................... | G01R 19/00 323/282 |

FOREIGN PATENT DOCUMENTS

JP H05-74140 A 3/1993

* cited by examiner

*Primary Examiner* — Kenneth B Wells
(74) *Attorney, Agent, or Firm* — McDermott Will & Emery LLP

(57) ABSTRACT

In a semiconductor device of related art, the degree of freedom when using one pad with plural functions has been disadvantageously low.
A semiconductor device has an internal logic circuit, a regulator circuit, and an interface circuit, and the regulator circuit and the interface circuit are coupled to one shared pad. In the case where a driving transistor of the regulator circuit is controlled to be in a conductive state, the shared pad is used as a terminal to which an input voltage of the regulator circuit is input. In the case where the driving transistor of the regulator circuit is controlled to be in a disconnected state, the shared pad is used as an input/output terminal of the interface circuit.

10 Claims, 7 Drawing Sheets

| TERMINAL MODE | CONTROL SIGNAL Sa, Sb |
|---|---|
| REGULATOR MODE (INPUT 5V→OUTPUT 1.25V) | 1.7V~2.5V |
| I/O PORT MODE | GND (0V) |
| DIRECT FEEDING MODE (LOGIC POWER SUPPLY VOLTAGE (ex. 1.25V)) | 5V OR 8V |

| TERMINAL MODE | CONTROL SIGNAL Sa | CONTROL SIGNAL Sc |
|---|---|---|
| REGULATOR MODE (INPUT 5V→OUTPUT 1.25V) | 1.7V~2.5V | GND (0V) |
| I/O PORT MODE | GND (0V) | 5V |
| DIRECT FEEDING MODE (LOGIC POWER SUPPLY VOLTAGE (ex. 1.25V)) | 5V OR 8V | GND (0V) |

TIMING CHART FOR SHOWING LOGIC LEVEL SWITCHING TIMING OF CONTROL SIGNALS Sa AND Sc (WHEN SEMICONDUCTOR DEVICE IS ACTIVATED)

FIG. 7

| TERMINAL MODE | CONTROL SIGNAL Sd | CONTROL SIGNAL Se |
|---|---|---|
| I/O PORT MODE | GND (0V) | 5V |
| VCL MODE (BYPASS CAPACITOR IS COUPLED TO TERMINAL) | 5V | GND (0V) |

FIG. 9

| TERMINAL MODE | CONTROL SIGNAL Sd | CONTROL SIGNAL Se |
|---|---|---|
| I/O PORT MODE | GND (0V) | 5V |
| GND MODE (TERMINAL IS GROUNDED) | 5V | GND (0V) |

SEMICONDUCTOR DEVICE HAVING A REGULATOR

CROSS-REFERENCE TO RELATED APPLICATIONS

The disclosure of Japanese Patent Application No. 2016-065278 filed on Mar. 29, 2016 including the specification, drawings and abstract is incorporated herein by reference in its entirety.

BACKGROUND

The present invention relates to a semiconductor device, and, for example, a semiconductor device having a regulator circuit that converts a power supply applied from the outside into an internal power supply to be supplied to internal circuits and an interface circuit that transmits and receives signals to/from the outside of the device.

In a semiconductor device, dies produced by the same design are mounted in packages that are different in the number of pins, or some functions of the semiconductor device are activated or inactivated. Accordingly, plural kinds of products whose functions apparently differ from each other are prepared using the dies produced by the same design, and it is possible to respond to various customer needs with the small number of kinds of dies. If the semiconductor device is prepared in such a way, the number of pads can be reduced by switching a function defined for one pad to another, and various products can be provided without changing the design of dies. Japanese Unexamined Patent Application Publication No. Hei 5 (1993)-74140 discloses an example of such a semiconductor device in which a function defined for a pad can be switched to another.

The semiconductor device described in Japanese Unexamined Patent Application Publication No. Hei 5 (1993)-74140 has internal circuits such as a memory element and a memory peripheral circuit, a regulator circuit provided between the internal circuits and an external terminal, and a low-impedance switch coupled parallel to the regulator circuit, and supplying of power to the internal circuits is selectively switched between the regulator circuit and the low-impedance switch.

SUMMARY

However, in the semiconductor device described in Japanese Unexamined Patent Application Publication No. Hei 5 (1993)-74140, a circuit such as a fuse is used for the low-impedance switch, and there is a problem that after the specification of a die is determined once, the specification of the die cannot be changed again.

The other objects and novel features will become apparent from the description of the specification and the accompanying drawings.

According to an embodiment, a semiconductor device has an internal logic circuit, a regulator circuit, and an interface circuit, and the regulator circuit and the interface circuit are coupled to one shared pad. In the case where a driving transistor of the regulator circuit is controlled to be in a conductive state, the shared pad is used as a terminal to which an input voltage of the regulator circuit is input. In the case where the driving transistor of the regulator circuit is controlled to be in a disconnected state, the shared pad is used as an input/output terminal of the interface circuit.

According to the embodiment, one shared pad can be properly used with plural functions by switching the operation state of the regulator circuit.

BRIEF DESCRIPTION OF THE DRAWINGS

FIG. 7 shows a table for explaining relations between operation modes and control signals in the semiconductor device according to the third embodiment;

FIG. 9 shows a table for explaining relations between operation modes and control signals in the semiconductor device according to the fourth embodiment.

DETAILED DESCRIPTION

Figure 1:
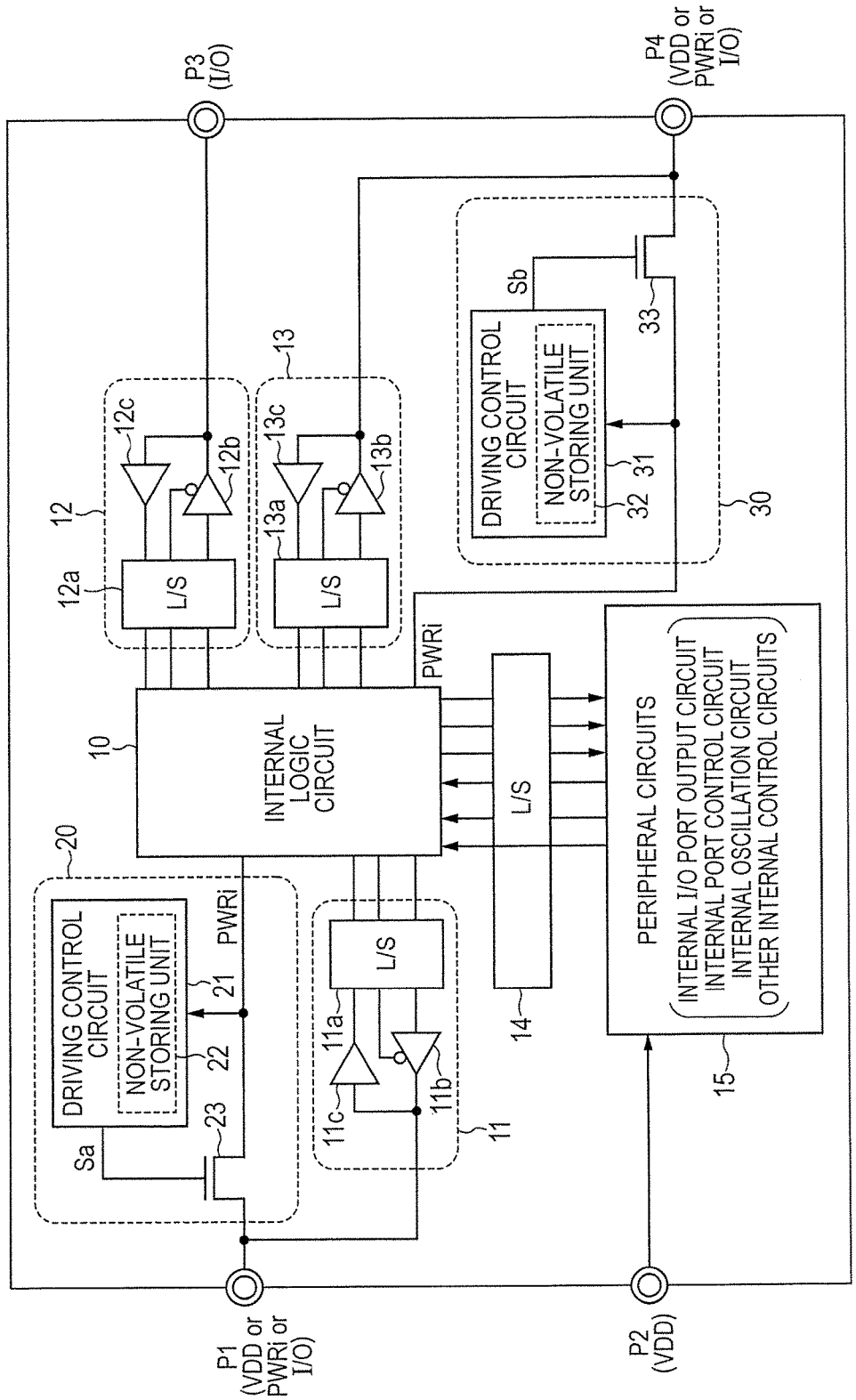
FIG. 1 is a block diagram of a semiconductor device according to a first embodiment.

In order to clearly explain the specification, the following description and the drawings are appropriately omitted and simplified. Further, the respective elements illustrated in the drawings as functional blocks for conducting various processes can be configured using a CPU, a memory, and other circuits as a hardware configuration, and can be realized using programs loaded into a memory as a software configuration. Thus, it can be understood by a person skilled in the art that the functional blocks can be realized in various forms such as by only hardware, only software, or a combination thereof, and the present invention is not limited to any one of these. It should be noted that the same elements are followed by the same signs in the respective drawings, and a duplicated explanation is omitted as needed.

Further, the above-described programs are stored using non-transitory computer readable media of various types, and can be supplied to a computer. The non-transitory computer readable media include tangible storage media of various types. Examples of the non-transitory computer readable media include a magnetic storage medium (for example, a flexible disk, a magnetic tape, or a hard disk drive), a magnetooptical storage medium (for example, a magnetooptical disk), a CD-ROM (Read Only Memory), a CD-R, a CD-R/W, and a semiconductor memory (for example, a mask ROM, a PROM (Programmable ROM), an EPROM (Erasable PROM), a flash ROM, or a RAM (Random Access Memory)). Further, the programs may be supplied to a computer through transitory computer readable media of various types. Examples of the transitory computer readable media include an electric signal, an optical signal, and an electromagnetic wave. The transitory computer readable media can supply the programs to a computer through a wired communication path such as an electric wire or an optical fiber, or a wireless communication path.

First Embodiment

A block diagram of a semiconductor device 1 according to a first embodiment is shown in FIG. 1. As shown in FIG. 1, the semiconductor device 1 has an internal logic circuit 10, external interface circuits 11 to 13, a level shift circuit 14, a peripheral circuit 15, and regulator circuits 20 and 30. Further, the semiconductor device 1 according to the first embodiment has shared pads P1 and P4 serving as terminals coupled to devices other than the semiconductor device 1, a power supply pad P2, and an I/O pad P3. A power supply VDD as one of operation power supplies for the semiconductor device 1 is supplied to the power supply pad P2 from a power supply device provided outside. In FIG. 1, the peripheral circuit 15 to which the power supply VDD is supplied is shown, but the power supply VDD is also supplied to circuits other than the internal logic circuit 10.

For example, the internal logic circuit 10 processes signals in the semiconductor device 1 on the basis of a program held in an incorporated storing unit. The internal logic circuit 10 is operated on the basis of the voltage of an internal power supply PWRi lower than that of the power supply VDD.

The external interface circuits 11 to 13 are interface circuits that transmit and receive signals to/from other devices provided outside the semiconductor device 1. The external interface circuit 11 transmits and receives signals to/from other devices through the shared pad P1. The external interface circuit 12 transmits and receives signals to/from other devices through the I/O pad P3. The external interface circuit 13 transmits and receives signals to/from other devices through the shared pad P4.

The external interface circuit 11 has a level shift circuit 11a, an output buffer 11b, and an input buffer 11c. The external interface circuit 12 has a level shift circuit 12a, an external interface circuit 12b, and an input buffer 12c. The external interface circuit 13 has a level shift circuit 13a, an output buffer 13b, and an input buffer 13c. Each of the level shift circuits 11a, 12a, and 13a converts a signal level between the signal level handled by the input buffer or the output buffer and the signal level handled by the internal logic circuit 10. The output buffers 11b, 12b, and 13b are buffer circuits that output signals to the outside through the pad. The input buffers 11c, 12c, and 13c are buffer circuits each of which transmits signals input through the pad to the internal circuit (for example, the internal logic circuit 10) of the semiconductor device 1.

The level shift circuit 14 converts a signal level between the peripheral circuit 15 and the internal logic circuit 10. The peripheral circuit 15 includes various circuits used for the internal logic circuit 10. In the example shown in FIG. 1, the peripheral circuit 15 includes an internal I/O (Input/Output) port output circuit, an internal port control circuit, an internal oscillation circuit, and other internal control circuits.

The regulator circuit 20 includes a driving transistor 23 coupled between the shared pad P1 and the internal logic circuit 10, and a driving control circuit 21 that drives the driving transistor 23 on the basis of the voltage of a wire coupling the driving transistor 23 and the internal logic circuit 10 to each other. The driving control circuit 21 has a non-volatile storing unit 22. The driving control circuit 21 controls the driving transistor 23 on the basis of an operation mode setting value stored in the non-volatile storing unit 22. In this case, an NMOS transistor formed using an N-type semiconductor is used for the driving transistor 23.

The regulator circuit 30 includes a driving transistor 33 coupled between the shared pad P4 and the internal logic circuit 10, and a driving control circuit 31 that drives the driving transistor 33 on the basis of the voltage of a wire coupling the driving transistor 33 and the internal logic circuit 10 to each other. The driving control circuit 31 has a non-volatile storing unit 32. The driving control circuit 31 controls the driving transistor 33 on the basis of an operation mode setting value stored in the non-volatile storing unit 32. In this case, an NMOS transistor formed using an N-type semiconductor is used for the driving transistor 33.

Here, the regulator circuits 20 and 30 will be described in more detail. Since the regulator circuits 20 and 30 are substantially the same, the regulator circuits 20 and 30 will be described below using the regulator circuit 20 as an example.

First, the driving control circuit 21 of the regulator circuit 20 has three operation modes. A first operation mode (for example, a regulator mode) is an operation mode in which the voltage of the internal power supply PWRi generated by lowering the voltage of the power supply applied to the shared pad P1 using the regulator circuit 20 is supplied to the internal logic circuit 10. In the regulator mode, the driving control circuit 21 controls the driving transistor 23 so that the regulator circuit 20 functions as a linear regulator. A second operation mode (for example, an I/O port mode) is an operation mode in which the shared pad P1 is used by the interface circuit (for example, the external interface circuit 11) to transmit and receive signals. In the I/O port mode, the driving control circuit 21 controls the driving transistor 23 so as to keep the disconnected state of the driving transistor 23. A third mode (for example, a direct feeding mode) is an operation mode in which the shared pad P1 and the internal logic circuit 10 are coupled as a wire. Specifically, in the direct feeding mode, the driving control circuit 21 controls the driving transistor 23 so as to minimize the resistance value of the driving transistor 23. Thus, the driving transistor 23 can be regarded as a wire.

The non-volatile storing unit 22 is a non-volatile memory such as a flash memory, and is a storing unit that can rewrite the stored operation mode setting value by accessing from the outside. FIG. 1 shows an example in which the storing unit storing the operation mode setting value is provided in the regulator circuit 20 as the non-volatile storing unit 22. However, it is only necessary to incorporate the non-volatile storing unit 22 in the semiconductor device 1, but the non-volatile storing unit 22 need not be provided in the regulator circuit 20. For example, the non-volatile storing unit 22 may be provided as a part of a storing unit that stores various setting values defining the operation of the program executed by the internal logic circuit 10 or the operation of the semiconductor device 1. Further, the operation mode setting value may be written into the semiconductor device 1 together with the program executed by the internal logic circuit 10, or may be written into the non-volatile storing unit 22 in an individual process. As described above, the operation mode setting value is written into the non-volatile storing unit 22 by the same process as the program incorporated in the semiconductor device 1. Accordingly, the operation modes of the regulator circuits 20 and 30 can be determined or changed even after the semiconductor device 1 is packaged.

Further, the non-volatile storing unit 22 is not limited to a non-volatile memory such as a flash memory, but may be, for example, an EEPROM (Electrically Erasable Programmable Read-Only Memory) whose state is electrically determined or a storing unit that determines the operation mode setting value by a pull-down resistor and a pull-up resistor provided outside.

Here, an operation of the regulator circuit 20 in each operation mode will be described. A table for explaining relations between operation modes and control signals in the semiconductor device 1 according to the first embodiment is shown in FIG. 2.

Figures 2, 3:
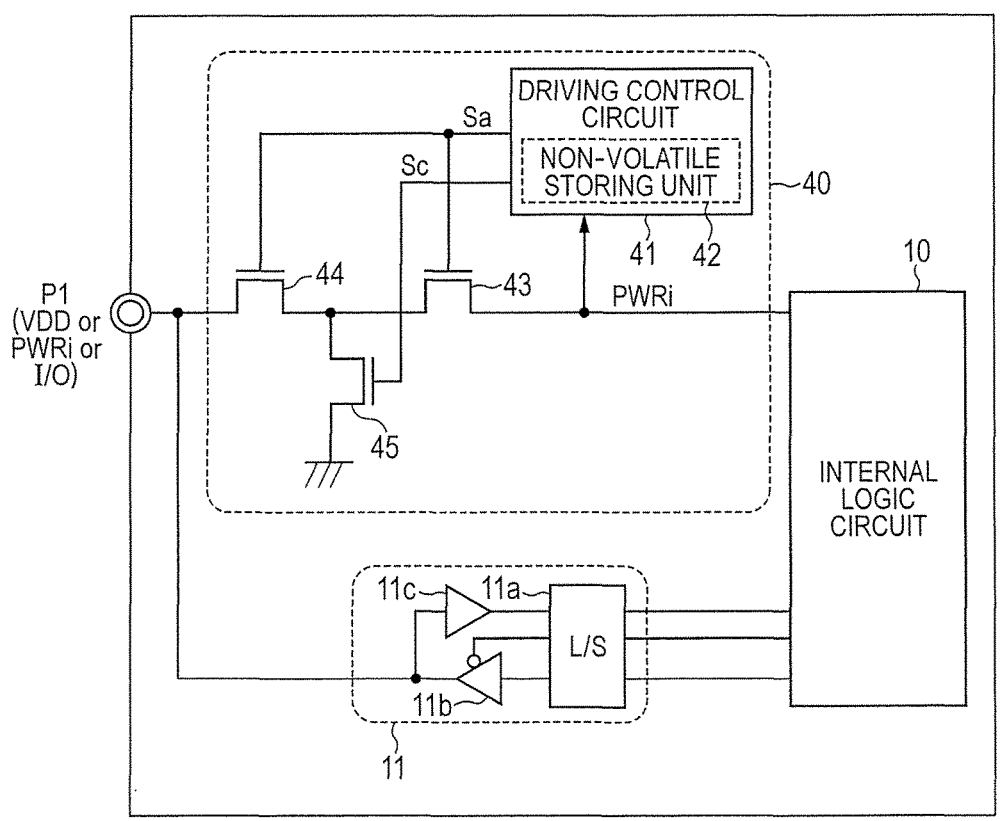
FIG. 2 shows a table for explaining relations between operation modes and control signals in the semiconductor device according to the first embodiment.
FIG. 3 is a block diagram of a semiconductor device according to a second embodiment.

As shown in FIG. 2, the driving control circuit 21 outputs a control signal Sa that keeps the voltage of the internal power supply PWRi constant to the gate of the driving transistor 23 in the regulator mode. The control signal Sa in the regulator mode is changed between about 1.7 V and 2.5 V if the voltage of the internal power supply PWRi is about 1.25 V. Further, the driving control circuit 21 in the regulator mode decreases the voltage level of the control signal Sa if the voltage of the internal power supply PWRi is lower than 1.25 V that is a target voltage, and increases the voltage level of the control signal Sa if the voltage of the internal power supply PWRi is equal to or higher than 1.25 V that is the target voltage. The regulator circuit 20 keeps the voltage of the internal power supply PWRi constant by controlling the driving transistor 23 with the driving control circuit 21, so that the internal power supply PWRi is supplied to the internal logic circuit 10.

Further, the internal logic circuit 10 turns an output of the output buffer 11*b* of the external interface circuit 11 to a high impedance state, and turns the input buffer 11*c* to an inactive state in the regulator mode. Accordingly, the semiconductor device 1 in which the regulator circuit 20 is operated as the regulator mode generates the internal power supply PWRi from the power supply VDD applied to the shared pad P1, and supplies the same to the internal logic circuit 10. In the regulator mode, the shared pad P1 functions as an input terminal of an input voltage to the regulator circuit 20.

Further, the driving control circuit 21 applies the control signal Sa of a first logic level to the gate of the driving transistor 23 to turn the driving transistor 23 to a disconnected state in the I/O port mode. The control signal Sa in the I/O port mode is of a low level, and is of a ground voltage (0 V). Accordingly, the driving transistor 23 is turned to a disconnected state, and no power is supplied from the regulator circuit 20 to the internal logic circuit 10 in the I/O port mode. Further, the internal logic circuit 10 allows the output buffer 11*b* to effectively function, and outputs a signal to the outside through the output buffer 11*b* and the shared pad P1 in the I/O port mode. Further, the internal logic circuit 10 receives a signal input through the shared pad P1 and the input buffer 11*c*. Namely, the shared pad P1 functions as an I/O port used for transmitting and receiving a signal in the I/O port mode.

Further, the driving control circuit 21 supplies to the gate of the driving transistor 23 the control signal Sa of a second logic level that is a logic level opposite to the first logic level in the direct feeding mode. Specifically, the control signal Sa in the direct feeding mode is of a high level, and has a voltage of about 5 V or 8 V. Further, a voltage (for example, about 1.25 V) defined as the internal power supply PWRi is supplied to the shared pad P1 in the direct feeding mode. In addition, a voltage sufficiently higher than the internal power supply PWRi applied to the shared pad P1 is applied to the gate of the driving transistor 23, so that the resistance of the driving transistor 23 becomes the same as that of a wire in the direct feeding mode. Accordingly, the internal power supply PWRi applied to the shared pad P1 is supplied to the internal logic circuit 10. It should be noted that a voltage of 5 V or 8 V may be used for a voltage generated by a high-voltage generation unit (not shown) provided in the semiconductor device 1 to control (writing or deleting) the non-volatile storing unit 22. Further, the voltage value is not limited to 5 V or 8 V, but may be adjusted to the voltage generated by the high-voltage generation unit.

Further, the internal logic circuit 10 turns an output of the output buffer 11*b* of the external interface circuit 11 to a high impedance state, and turns the input buffer 11*c* to an inactive state in the regulator mode. Accordingly, the semiconductor device 1 in which the regulator circuit 20 is operated as the direct feeding mode supplies the internal power supply PWRi applied to the shared pad P1 to the internal logic circuit 10. In the direct feeding mode, the shared pad P1 functions as a power supply input terminal for the internal logic circuit 10.

As described above, in the semiconductor device 1 according to the first embodiment, the control method for the driving transistors 23 and 33 of the regulator circuits 20 and 30 that generate the internal power supply PWRi from the input voltage applied to the shared pads P1 and P4 is switched in accordance with the operation mode, so that the shared pads P1 and P4 function as any one of input terminals of the regulators, I/O ports, and power source input terminals. Further, when the functions of the shared pads P1 and P4 are switched, no irreversible change is added to the circuits in the semiconductor device 1 according to the first embodiment. Thus, in the semiconductor device 1 according to the first embodiment, various kinds of pad layouts larger than the number of arranged pads can be realized without providing a pad for each function on a chip on which the semiconductor device 1 is formed.

Further, the specification of the shared pad P1 or the functions of the semiconductor device 1 can be changed even after the semiconductor chip is packaged in the semiconductor device 1 according to the first embodiment. The changes can be made many times. Therefore, the semiconductor device with the specification of the shared pad changed in accordance with a request by a customer after packaging the same die can be shipped, and the die can be easily managed in the semiconductor device 1 according to the first embodiment.

Further, the operation mode setting value for determining the operation mode of the regulator circuit 20 is stored in the non-volatile storing unit 22, and the operation mode setting value can be rewritten in the semiconductor device 1 according to the first embodiment. Accordingly, the function of the shared pad after packaging the semiconductor chip can be further easily changed in the semiconductor device 1 according to the first embodiment.

Further, the driving transistor 23 of the regulator circuit 20 is configured using an NMOS transistor in the semiconductor device 1 according to the first embodiment. In the case where the shared pad is used in the I/O port mode, the amplitude of a signal input to the shared pad exceeds the power supply voltage VDD of the semiconductor device 1 in some cases. In such a case, in the case where the driving transistor 23 is formed using a PMOS transistor, even if a voltage of the same level as that of the power supply VDD is applied to the gate of the PMOS transistor, there is a possibility that a voltage between the source and the gate of the PMOS transistor exceeds a threshold value and the PMOS transistor is turned on when a voltage applied to the source of the PMOS transistor becomes higher than that of the power supply VDD. However, in the case where the driving transistor 23 is formed using an NMOS transistor, the drain of the NMOS transistor is coupled to the shared pad. Thus, if a low-level voltage (for example, 0 V) is applied to the gate of the NMOS transistor, a voltage between the source and the drain of the NMOS transistor does not exceed a threshold value even when a voltage applied to the drain of the NMOS transistor becomes higher than that of the power supply VDD. Thus, the disconnected state of the driving transistor 23 is kept. Accordingly, it is possible to prevent problems caused by a voltage applied to the shared pad by using an NMOS transistor as the driving transistor 23 in the semiconductor device 1 according to the first embodiment.

Second Embodiment

In a second embodiment, a regulator circuit 40 having a configuration different from those of the regulator circuits 20 and 30 according to the first embodiment will be described. A block diagram of a semiconductor device 2 including the regulator circuit 40 according to the second embodiment is shown in FIG. 3. In the semiconductor device 2 according to the second embodiment, the regulator circuit 20 of the semiconductor device 1 according to the first embodiment is replaced by the regulator circuit 40. However, only the regulator circuit 40, the external interface circuit 11, the internal logic circuit 10, and the shared pad P1 are shown in FIG. 3.

As shown in FIG. 3, the regulator circuit 40 according to the second embodiment has a driving control circuit 41 corresponding to the driving control circuit 21 and a non-volatile storing unit 42 corresponding to the non-volatile storing unit 22. In this case, the driving control circuit 41 outputs a first control signal (for example, a control signal Sa) and a second control signal (for example, a control signal Sc). Further, the regulator circuit 40 has a first transistor (for example, a driving transistor 43), a second transistor (for example, a driving transistor 44), and a third transistor (for example, a transistor 45) as driving transistors. The driving transistors 43 and 44 and the transistor 45 are formed using NMOS transistors.

The driving transistor 43 and the driving transistor 44 are controlled by the control signal Sa, and are coupled in series between the shared pad and the internal logic circuit. The transistor 45 is coupled between a wire coupling the driving transistor 43 to the driving transistor 44 and a ground wire, and is controlled by the control signal Sc at a voltage level different from the control signal Sa.

In the second embodiment, since the configurations of the driving transistors are different, the control signal output from the driving control circuit 41 in each of the regulator mode, the I/O port mode, and the direct feeding mode is different from that output from the driving control circuit 21 of the first embodiment. Accordingly, an operation of the driving control circuit 41 according to the second embodiment will be described. A table for explaining relations between operation modes and control signals in the semiconductor device according to the second embodiment is shown in FIG. 4.

Figures 4, 5:
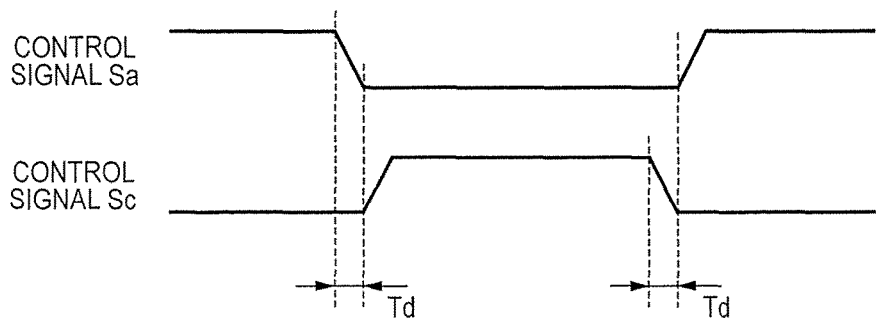
FIG. 4 shows a table for explaining relations between operation modes and control signals in the semiconductor device according to the second embodiment.
FIG. 5 shows a timing chart for explaining the transition timing of the voltage level of each of control signals in the semiconductor device according to the second embodiment.

As shown in FIG. 4, the control signal Sa output from the driving control circuit 41 is the same as that of the semiconductor device 1 according to the first embodiment. On the other hand, the control signal Sc output from the driving control circuit 41 is of a high level (for example, 5 V that is equal to the power supply VDD) in the I/O port mode, but is of a low level (for example, 0 V that is equal to the ground voltage) in the regulator mode and the direct feeding mode.

Namely, the driving control circuit 41 sets the control signal Sa at a voltage level at which the voltage of the internal power supply PWRi is kept constant, and sets the control signal Sc to the ground voltage in the regulator mode. The driving control circuit 41 sets the control signal Sa at a first logic level (for example, a low level), and sets the control signal Sc at a second logic level (for example, a high level) in the I/O port mode. The driving control circuit 41 sets the control signal Sa at the second logic level (for example, a high level), and sets the control signal Sc at the first logic level (for example, a low level) in the direct feeding mode.

The driving transistors 43 and 44 are controlled as one driving transistor in the regulator mode under the above-described control, and thus the regulator circuit 20 functions as a linear regulator for generating the internal power supply PWRi on the basis of a voltage input to the shared pad P1. In the I/O port mode, the driving transistors 43 and 44 are controlled so as to be in a disconnected state, and a ground voltage is applied to a node between the driving transistor 43 and the driving transistor 44. Further, in the direct feeding mode, the resistance of each of the driving transistors 43 and 44 becomes equal to that of a wire that is low in resistance, and the transistor 45 is turned to a disconnected state. It should be noted that the operations of the internal logic circuit 10 and the external interface circuit 11 in each mode are the same as those of the semiconductor device 1 according to the first embodiment.

The ground voltage is applied to a node between the driving transistor 43 and the driving transistor 44 especially in the I/O port mode in the semiconductor device 2 according to the second embodiment. Therefore, even when noise is generated in a wire on the internal logic circuit 10 side of the driving transistor due to a signal communicated using the shared pad P1, the noise is blocked by the transistor 45 in the semiconductor device 2 according to the second embodiment. An influence of the noise on the internal logic circuit 10 due to communications through the shared pad P1 is prevented in the semiconductor device 2 according to the second embodiment.

Further, switching noise due to a change in the logic level of the control signal applied to each of the driving transistors 43 and 44 and the transistor 45 can be reduced by adjusting the voltage transition timing of each of the control signals Sa and Sc in the semiconductor device 2 according to the second embodiment. A timing chart for explaining the transition timing of the voltage level of each of the control signals in the semiconductor device according to the second embodiment is shown in FIG. 5.

It should be noted that the logic level of the control signal applied to each of the driving transistors 43 and 44 and the transistor 45 is transited when activating the semiconductor device 2 in the semiconductor device 2 according to the second embodiment. Thus, the voltage transition timing of each control signal in an activation process of the semiconductor device 2 will be described below.

As shown in FIG. 5, among the driving transistors 43 and 44 and the transistor 45, one (s) in a conductive state is (are) turned to a disconnected state, and then the other(s) in a disconnected state is (are) switched to a conductive state in the semiconductor device 2 according to the second embodiment. Further, a delay time Td is added to the voltage transition start timing of each of the two control signals. By setting the delay times Td, the driving transistors 43 and 44 and the transistor 45 are prevented from being simultaneously turned to a conductive state.

In the case where the driving transistors 43 and 44 and the transistor 45 are simultaneously turned to a conductive state, the wire supplying the internal power supply PWRi to the internal logic circuit 10 is drawn to the ground voltage side through the transistor 45, and thus a failure in activation possibly occurs. Further, in the case where the driving transistors 43 and 44 and the transistor 45 are simultaneously turned to a conductive state, the shared pad P1 is drawn to the ground voltage side through the transistor 45, and overcurrent possibly flows in a device to be coupled.

However, the driving transistors 43 and 44 and the transistor 45 are not simultaneously turned to a conductive state by controlling the control signals Sa and Sc while adding the delay times Td as shown in FIG. 5, and thus the above-described problems can be solved.

Third Embodiment

Figure 6:
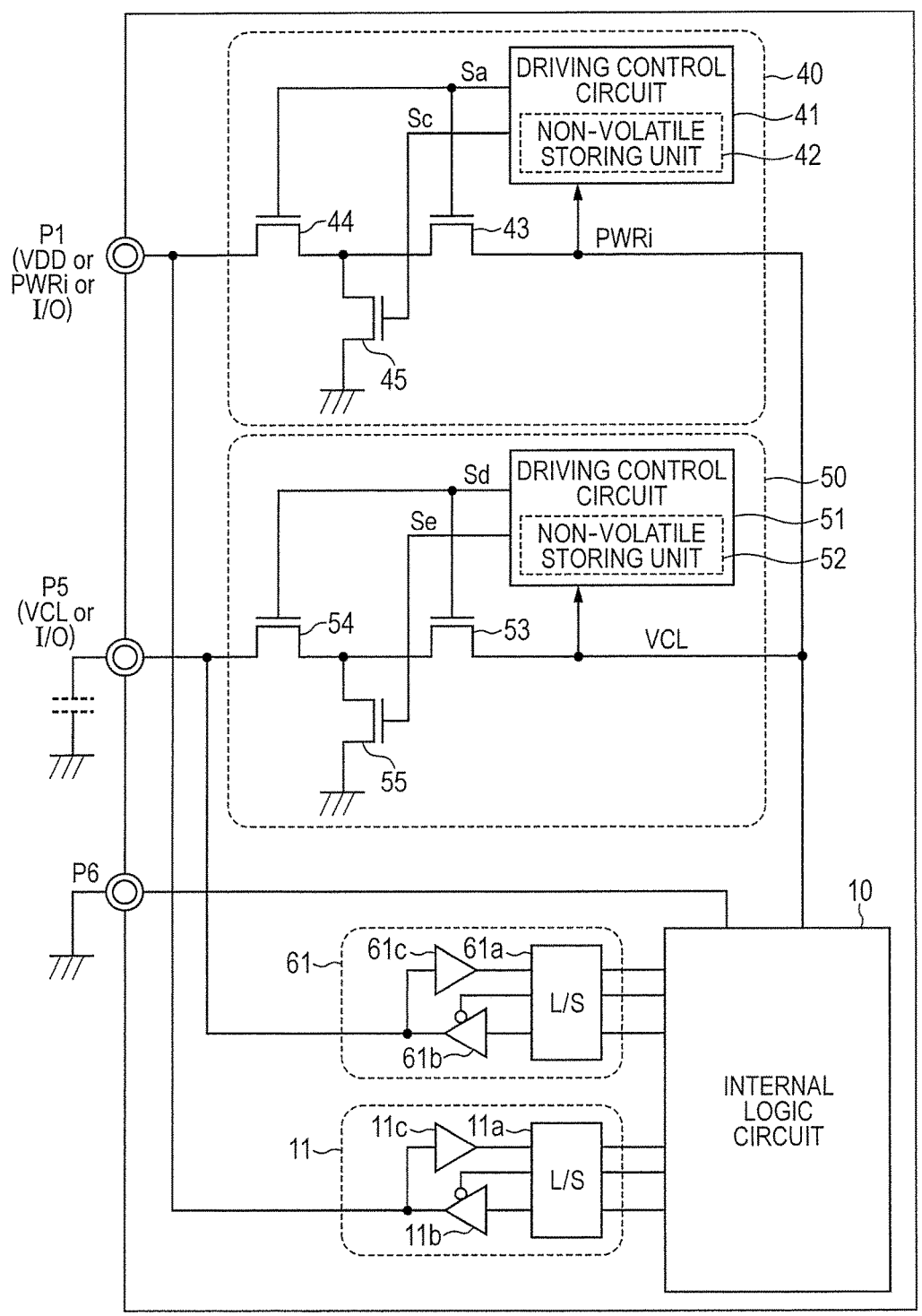
FIG. 6 is a block diagram of a semiconductor device according to a third embodiment.

In a third embodiment, another method of using the shared pad used in the regulator circuit 40 according to the second embodiment will be described. A block diagram of a semiconductor device 3 according to the third embodiment is shown in FIG. 6. As shown in FIG. 6, in the semiconductor device 3 according to the third embodiment, a regulator circuit 50 having the same circuit configuration as the regulator circuit 40 and an external interface circuit 61 having the same circuit configuration as the external interface circuit 11 are added to the semiconductor device 2 according to the second embodiment. The regulator circuit 50 and the external interface circuit 61 are coupled to a shared pad P5.

In addition, a bypass capacitor is coupled to the shared pad P5 when the regulator circuit 50 is operated in a VCL mode realized by the same control as in the direct feeding mode in the semiconductor device 3 according to the third embodiment. Further, when the regulator circuit 50 is used in the I/O port mode, the shared pad P5 is used as an I/O port in the semiconductor device 3 according to the third embodiment.

A table for explaining relations between operation modes and control signals in the semiconductor device according to the third embodiment is shown in FIG. 7. It should be noted that FIG. 7 shows only relations between the operation modes of the VCL mode and the I/O port mode and control signals Sd and Se. As shown in FIG. 7, the control signals Sd and Se in the VCL mode are the same as those in the direct feeding mode of the second embodiment.

In the case where the regulator circuit 40 is operated in the direct feeding mode, a bypass capacitor is added in some cases in order to secure the stability of power applied to the internal logic circuit 10. In such a case, the stability of the power supply for the internal logic circuit 10 by the bypass capacitor coupled to the shared pad P5 can be realized by setting the regulator circuit 50 to the VCL mode operated by the same control as the direct feeding mode in the semiconductor device 3 according to the third embodiment.

Fourth Embodiment

Figure 8:
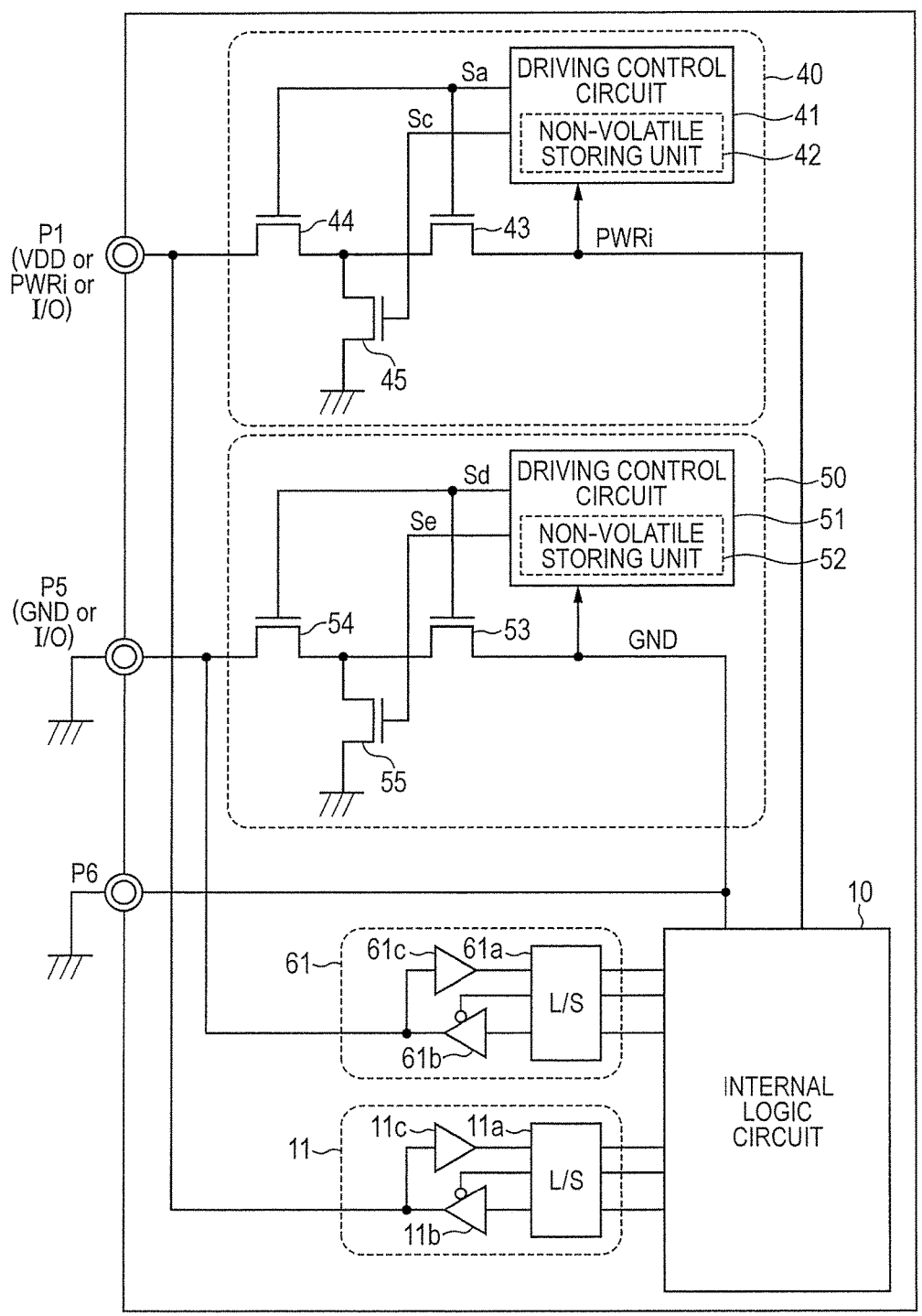
FIG. 8 is a block diagram of a semiconductor device according to a fourth embodiment.

In a fourth embodiment, another method of using the shared pad used in the regulator circuit 40 according to the second embodiment will be described. A block diagram of a semiconductor device 4 according to the fourth embodiment is shown in FIG. 8. As shown in FIG. 8, in the semiconductor device 4 according to the fourth embodiment, a regulator circuit 50 having the same circuit configuration as the regulator circuit 40 and an external interface circuit 61 having the same circuit configuration as the external interface circuit 11 are added to the semiconductor device 2 according to the second embodiment. The regulator circuit 50 and the external interface circuit 61 are coupled to a shared pad P5. Further, in the example shown in FIG. 8, a ground pad P6 supplying the ground voltage to the internal logic circuit 10 is shown.

In addition, in the semiconductor device 4 according to the fourth embodiment, when the regulator circuit 50 is operated in a GND mode realized by the same control as the direct feeding mode, the shared pad P5 is coupled to a ground wire. Further, when the regulator circuit 50 is used in the I/O port mode, the shared pad P5 is used as an I/O port in the semiconductor device 4 according to the fourth embodiment.

A table for explaining relations between operation modes and control signals in the semiconductor device according to the fourth embodiment is shown in FIG. 9. It should be noted that FIG. 9 shows only relations between the operation modes of the GND mode and the I/O port mode and control signals Sd and Se. As shown in FIG. 9, the control signals Sd and Se in the GND mode are the same as those in the direct feeding mode of the second embodiment.

In the case where the regulator circuit 40 is operated in the direct feeding mode, a ground terminal is added in some cases in order to secure the stability of a ground voltage applied to the internal logic circuit 10. In such a case, the stability of the power supply for the internal logic circuit 10 by the ground wire coupled to the shared pad P5 can be realized by setting the regulator circuit 50 to the GND mode operated by the same control as the direct feeding mode in the semiconductor device 4 according to the fourth embodiment.

The invention achieved by the inventors has been described above in detail on the basis of the embodiments. However, it is obvious that the present invention is not limited to the above-described embodiments, but can be variously changed without departing from the scope thereof.

What is claimed is:

1. A semiconductor device comprising:
  a shared pad to which a plurality of circuits are coupled;
  a regulator circuit that includes a driving transistor coupled between the shared pad and an internal logic circuit and a driving control circuit that provides a first control signal to the driving control circuit to drive the driving transistor on the basis of a voltage of a wire coupling the driving transistor and the internal logic circuit to each other; and
  an interface circuit coupled to the shared pad,
  wherein the driving control circuit has, at least, three operation modes including a first operation mode in which an internal power supply generated by lowering a power supply applied to the shared pad using the regulator circuit is supplied to the internal logic circuit, a second operation mode in which the interface circuit uses the shared pad to transmit and receive signals, and a third operation mode in which the shared pad and the internal logic circuit are coupled to each other as a wire,
  wherein the driving control circuit sets:
    the first control signal at a voltage level at which the voltage of the internal power supply is kept constant in the first operation mode,
    the first control signal at a first logic level to switch the driving transistor to a disconnected state in the second operation mode, and
    the first control signal at a second logic level that is a logic level opposite to the first logic level is applied to the driving transistor in the third operation mode.

2. The semiconductor device according to claim 1, further comprising a non-volatile storing unit that stores an operation mode setting value by which one of the operation modes to operate the regulator circuit is determined and can rewrite the stored operation mode setting value, and the driving control circuit determines the operation mode by reading the operation mode setting value when being activated.

3. The semiconductor device according to claim 1, wherein
the driving transistor of the regulator circuit comprises a first transistor and a second transistor that are controlled by the first control signal and are coupled in series between the shared pad and the internal logic circuit,
the regulator circuit further includes a third transistor that is coupled between a wire coupling the first transistor and the second transistor to each other and a ground wire, and is controlled by a second control signal of a voltage level different from that of the first control signal,
wherein the driving control circuit sets the first control signal at the voltage level at which the voltage of the internal power supply is kept constant and sets the second control signal to the ground voltage in the first operation mode,
wherein the driving control circuit sets the first control signal at the first logic level and sets the second control signal at the second logic level in the second operation mode, and
wherein the driving control circuit sets the first control signal at the second logic level and sets the second control signal at the first logic level in the third operation mode.

4. The semiconductor device according to claim 3, wherein the driving control circuit sets to the first logic level the voltage level of one of the first control signal and the second control signal set at the second logic level, and then switches the voltage level set at the first logic level to the second logic level after a predetermined delay time.

5. The semiconductor device according to claim 1, wherein one of an external power supply having a voltage corresponding to the voltage of the internal power supply, a ground power supply having a ground voltage, and a bypass capacitor is coupled to the shared pad in the third operation mode.

6. The semiconductor device according to claim 1, wherein the driving transistor is formed using an N-type semiconductor.

7. A semiconductor device comprising:
a pad; and
a regulator circuit that includes a driving transistor coupled between the pad and an internal logic circuit and a driving control circuit that drives the driving transistor based on an output voltage of the driving transistor;
wherein the driving control circuit has two operation modes including a first operation mode in which an internal power supply is generated by lowering a power supply applied to the pad using the regulator circuit and a second operation mode in which a power supply applied to the pad is used for an internal power supply,
wherein a first control signal that keeps the voltage of the internal power supply constant is applied to the driving transistor in the first operation mode, and
wherein a second control signal of a first logic level is applied to the driving transistor to switch the driving transistor to a connected state in the second operation mode.

8. The semiconductor device according to claim 7, further comprising a non-volatile storing unit that stores an operation mode setting value by which one of the operation modes to operate the regulator circuit is determined and rewrites the stored operation mode setting value, wherein
the driving control circuit determines the operation mode by reading the operation mode setting value when being activated.

9. The semiconductor device according to claim 7, wherein one of an external power supply having a voltage corresponding to the voltage of the internal power supply, a ground power supply having a ground voltage, and a bypass capacitor is coupled to the pad in the second operation mode.

10. The semiconductor device according to claim 7, wherein the driving transistor is an NMOS transistor.

* * * * *